United States Patent [19]

Nossek

[11] 4,364,116
[45] Dec. 14, 1982

[54] SWITCHED-CAPACITOR FILTER CIRCUIT HAVING AT LEAST ONE SIMULATED INDUCTOR

[75] Inventor: Josef Nossek, Munich, Fed. Rep. of Germany

[73] Assignee: Siemens Aktiengesellschaft, Berlin & Munich, Fed. Rep. of Germany

[21] Appl. No.: 173,759

[22] Filed: Jul. 30, 1980

[30] Foreign Application Priority Data

Aug. 9, 1979 [DE] Fed. Rep. of Germany ....... 2932419
Jan. 21, 1980 [DE] Fed. Rep. of Germany ....... 3002056

[51] Int. Cl.$^3$ ............................................. G06G 7/62
[52] U.S. Cl. .................................... 364/825; 333/214; 364/802
[58] Field of Search ................ 364/802, 825; 333/214, 333/215; 328/167; 333/109; 307/109, 110

[56] References Cited

U.S. PATENT DOCUMENTS

| | | | |
|---|---|---|---|
| 3,750,037 | 7/1973 | Schmidt | 333/214 X |
| 3,835,399 | 9/1974 | Holmes | 333/214 X |
| 3,886,469 | 5/1975 | Rollett et al. | 333/214 X |
| 3,936,777 | 2/1976 | Rollett et al. | 333/214 X |
| 4,168,440 | 9/1979 | Gray | 333/214 X |

OTHER PUBLICATIONS

Moschytz–"Inductorless Filters:–A Survey"–IEEE Spectrum, Sep. 1970–pp. 63–75.
Temes et al.–"Switched-Capacitor Filter Design Using the Bilinear Z-Transform"–IEEE Transactions on Circuits and Systems–vol. CAS-25, No. 12, Dec. 1978, pp. 1039–1044.
Temes et al.–"Switched Capacitor Circuits Bilinearly Equivalent to Floating Inductor or F.D.N.R."–Electronics Letters, Feb. 1, 1979, vol. 15, No. 3–pp. 87 and 88

Primary Examiner—Joseph F. Ruggiero
Attorney, Agent, or Firm—Hill, Van Santen, Steadman, Chiara & Simpson

[57] ABSTRACT

A switched-capacitor filter circuit having at least one simulated inductor and having an operational amplifier with a capacitor interconnected between its output and inverting input and a non-inverting input connected to a reference potential has a switch leading from the inverting input of the amplifier to a first circuit node from which a first capacitor is connected to the reference potential and also from which a second switch leads to a second circuit node from which another capacitor is connected to the reference potential, and has a third switch leading from the second circuit node to the inverting input of the amplifier and a fourth switch connected between the output of the amplifier and the second circuit node and a fifth switch connected to an input terminal. Each of the switches is controlled by one of a series of sequential non-overlapping clock pulse voltages with the first and fifth switches being simultaneously closed followed by sequential closing of the second, third and fourth switches.

9 Claims, 14 Drawing Figures $$Z = sL = \psi R_c$$
$$R_c = \frac{T}{2C}, \quad L = \frac{T^2}{4C}$$

FIG 4
FIG 5
$Z = sL = \psi R_C$
$L = \dfrac{T^2}{4C}$
$R_C = \dfrac{T}{2C}$
$R' = \dfrac{T}{C'}$
FIG 6
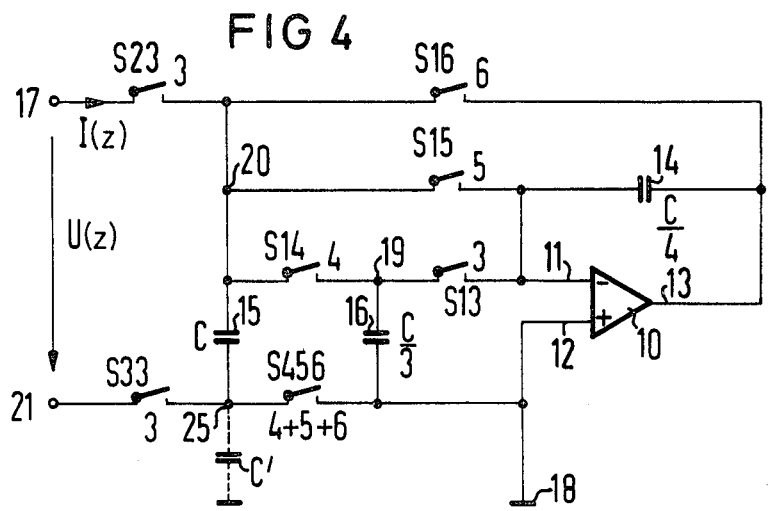
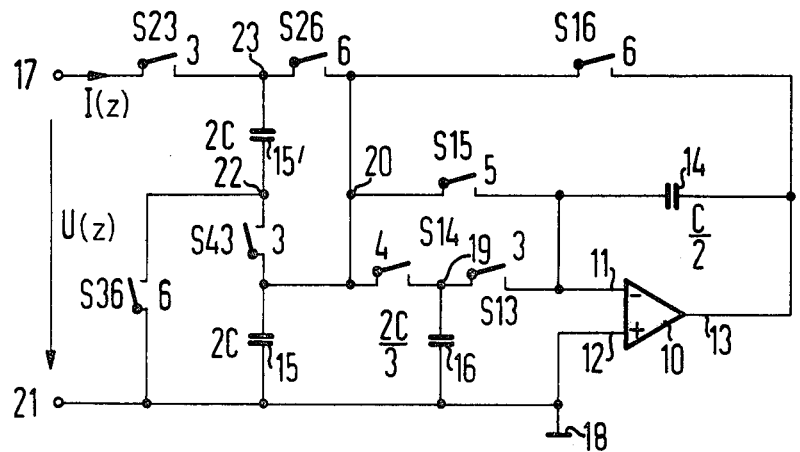

SWITCHED-CAPACITOR FILTER CIRCUIT HAVING AT LEAST ONE SIMULATED INDUCTOR

BACKGROUND OF THE INVENTION

1. Field of the Invention

The present invention relates to switched-capacitor filter circuits and in particular to such circuits having at least one simulated inductor which contains switches, capacitors and amplifiers controlled according to predetermined clock pulses and in which an operational amplifier is provided between whose output and inverting input a capacitor is connected and whose non-inverting input is connected to a fixed reference potential.

2. Description of the Prior Art

Switched-capacitor (SC) filters are known from the article "Switched-Capacitor Filter Design Using The Bilinear z-Transform" in the periodical "IEEE Transactions on Circuits and Systems," Vol. Cas-25, No. 12, December 1978, pages 1039 through 1044 as well as from the article "Switched-Capacitor Circuits Bilinearly Equivalent To Floating Inductor Or F.D.N.R." in the periodical Electronics Letters, Feb. 1, 1979, Vol. 15, No. 3, pages 87 and 88. Such filters do not process time-continuous analog signals in the true sense, but rather process time-discrete signals which exist in the form of samples, which samples are generated according to a clock frequency F via the relationship $T=1/F$, where T is the clock period. Circuits for generating such samples are known to those skilled in the art and are not explained in detail herein. Such sampling circuits can be pre- or post-connected to the known circuits illustrated, so that samples derived from an analog signal are supplied to the filter circuit at its input side and the signals available at the output side are re-converted into time-continuous analog signals. The significant, technical advantage of such filters is that coils are simulated by means of active circuit elements and capacitors, which are suitable for the monolithic integration of larger filter circuits. Known operational amplifiers are predominantly employed as amplifiers and one thereby strives, on the one hand, to require the smallest possible number of circuit elements and, on the other hand, to also guarantee the stability of such circuits.

In the aforementioned known circuits, the inverting input is also connected via a capacitor to the output of an operational amplifier, so-called "counter-coupled." Some operational amplifiers employed are at times not counter-coupled or may require a high common mode rejection, because the inverting input of the operational amplifier is briefly not counter-coupled during certain switching phases or the non-inverting input is not always held at grounded potential. Further, if the realization of the capacitors ensues by metal-oxide-semiconductor (MOS) technology the unavoidable ground capacitance connected with every floating MOS capacitor can lead to significant disruptions of the filter function.

SUMMARY OF THE INVENTION

It is an object of the present invention to provide circuits for the simulation of actively realizable coils which can be employed both as floating as well as single-sided, grounded coils in so-called switched-capacitor-filters and in which disruptions occurring due to switching operations are minimized.

It is a further object of the present invention to provide a circuit for the realization of a floating parallel resonance circuit which essentially requires the same number of circuit elements as a simulated inductor.

The above objects are inventively achieved in an SC filter having a switch which leads from the inverting input of the operational amplifier to a first circuit node, proceeding from which a capacitor is connected to grounded potential; and a switch which leads to a second circuit node, proceeding from which a capacitor is connected to grounded potential; a switch which leads from the second circuit node to the inverting input of the amplifier and a further switch which leads to the output of the operational amplifier. The switches close simultaneously during a clock phase and the switches are successively closed in subsequent, chronologically non-overlapping clock phases.

DESCRIPTION OF THE DRAWINGS

FIG. 4 is a circuit diagram for the realization of a floating inductor constructed in accordance with the principles of the present invention.

FIG. 5 is an equivalent circuit for the circuit of FIG. 4 with designations analogous to FIG. 3.

FIG. 6 is a circuit diagram for the realization of a grounded inductor with reduced level control of the operational amplifier constructed in accordance with the principles of the present invention.

DESCRIPTION OF THE PREFERRED EMBODIMENTS

Figure 1:
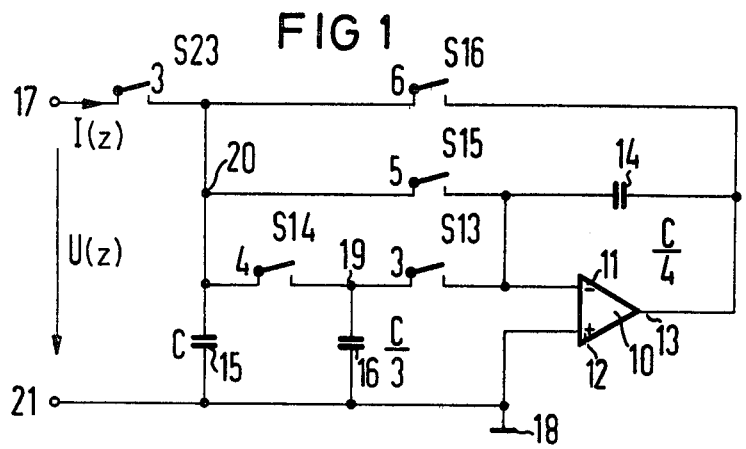
FIG. 1 is a circuit diagram for the realization of a single-sided, grounded inductor constructed in accordance with the principles of the present invention.

In the sample embodiment of FIG. 1, an operational amplifier 10 has a non-inverting input 12 connected to a reference potential such as to grounded potential 18. The output of the operational amplifier is referenced at 13; the inverting input is referenced at 11; and a capacitor 14 between the output 13 and the inverting input 11 is assumed as a preferred embodiment to have the capacitance value C/4. The circuit is further comprised of switches S13, S14, S15, S16 and S23, of which the switch S13 leads to a circuit node 19 and the switches S15 and S16 lead to a circuit node 20 are connected to one another via the switch S14 and, further, a capacitor 16 lies between the circuit node 19 and grounded potential 18, whereas a capacitor 15 lies between the circuit node 19 and reference potential 18. The simulation of a loss-free coil occurs when, given a capacitance value C/4 of the capacitor 14, the capacitance value of the capacitor 16 amounts to C/3, and the capacitor 15 has the capacitance value C. The circuit node 20 is connected via the switch S23 to the upper input terminal 17. The lower input terminal is referenced at 21. In the circuit of FIG. 1, the input terminal 21 also lies at reference potential 18. If a voltage U(z) is supplied between the terminals 17 and 21, a current I(z) flows in the circuit.

The referencing of the switches is selected in FIG. 1 and for the remaining figures in such manner that the switches S are referenced in conjunction with a two digit number whose second numeral coincides with the clock phases during which these switches must be closed.

Figure 2:
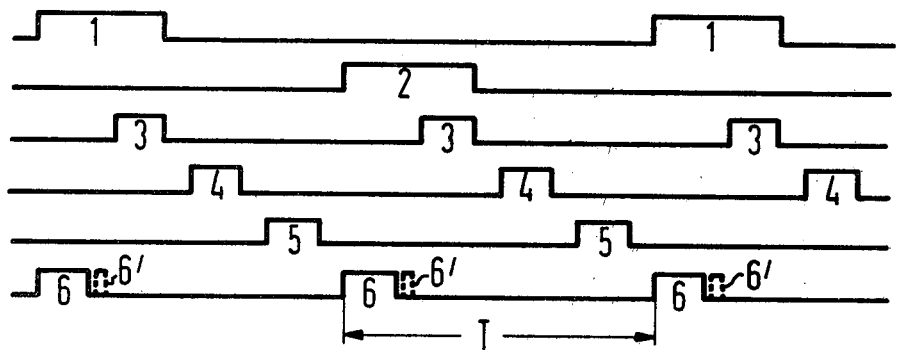
FIG. 2 is a clock pulse diagram for actuation of the individual switches in the clock phases 1 through 6' with the clock period T for the circuits described herein.

The individual clock phases are illustrated in FIG. 2, whereby the times during which the individual switches are closed are identified by the pulse which projects above the reference line. Further, the individual clock pulses do not overlap, as can be seen, for example, by the clock phases 3, 4, 5 and 6. For example, the clock phase 4 may only be closed when switches operated with the clock phase 3 have already been opened. This also applies to the remaining switches. In FIG. 2, the clock period T initially defined is also illustrated.

The operation of the circuit of FIG. 1 in conjunction with FIG. 2 is such that the switches S13 and S23 must be closed during the clock phase 3, the switch S14 must be closed during the clock phase 4, the switch S15 must be closed during the clock phase 5 and the switch S16 must be closed during the clock phase 6.

In the realization of a grounded inductor illustrated in FIG. 1, the grounded capacitances have absolutely no influence, because the required MOS capacitors are either grounded or are connected with one electrode to a low-resistance operational amplifier output. Further, the non-inverting input 11 of the operational amplifier always lies at grounded potential and is, moreover, always counter-coupled by means of the capacitor 14.

Figure 3:
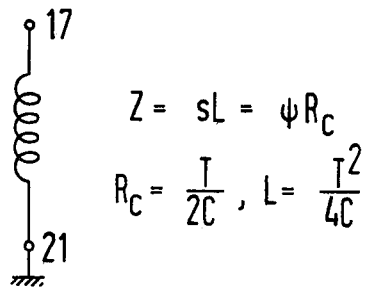
FIG. 3 is an equivalent circuit for the circuit of FIG. 1.

In the electrical equivalent circuit of FIG. 3, the effect of the circuit according to FIG. 1 between the terminals 17 and 21 can be directly seen. The impedance Z of the circuit is thereby determined according to the equation $Z = s \cdot L = \Psi \cdot R_c$, whereby $R_c = T/2C$ and $L = T^2/4C$. Further, the complex frequency variable of the reference filter is defined with $s = \Sigma + j\Omega$ and the so-called $\Psi$-transformation is taken into consideration by means of the magnitude $\Psi = T/2 \cdot s$, the theoretical content of said $\Psi$-transformation being known and which will be explained below in conjunction with the invention. The value $R_c$ is the so-called surge resistance for which the expression "step resistance" is also utilized.

This latter advantage is also completely retained in the sample embodiment of FIG. 4 in which the realization of a floating inductor, i.e., an inductor not lying single-sided at reference potential, is illustrated. An impedance from a coil terminal to ground is added which, however, in many cases, may again be eliminated by means of a suitable arrangement of the overall circuit or, in any case, by means of the employment of an additional amplifier.

In the sample embodiment of FIG. 4 and the equivalent circuit in FIG. 5, the realization of a floating inductor is shown. Elements common to FIG. 1 are identically referenced and also operate in accord with the clock phases shown in FIG. 2.

Deviating from FIG. 1 in the circuit according to FIG. 4, a further switch S33 is disposed between the input terminal 21, through which the circuit node 25 is reached. A switch S456 leads directly from the circuit node 25 to the non-inverting input 12 of the operational amplifier 10, said non-inverting input lying at grounded potential. As the switch S23, the switch S33 is closed during the clock phase 3, whereas the switch S456 is closed during the clock phases 4, 5 and 6. A parasitic switch capacitance develops between the node 25 and the grounded potential, said parasitic switch capacitance being indicated with broken lines and its capacitance value being referenced with C'. The explanations already made with respect to FIG. 3 also apply to the electrical equivalent circuit of FIG. 5 and the resulting formula relationships are also directly indicated there at the individual circuit elements. Accordingly, a floating inductor appears between the terminals 17 and 21 and a bleeder resistor $R' = T/C'$ forms between the terminal 21 and the reference potential, as does a parasitic capacitance with the value C'/2 in parallel therewith.

In the sample embodiment of FIG. 6, the realization of a grounded inductor according to FIG. 1 is shown with reduced level control of the operational amplifier. Circuits of this type can also be constructed accordingly in the realization of floating inductors according to FIG. 4. Circuit elements common to FIG. 1 are identically referenced in FIG. 6. In comparison with FIG. 1, a further circuit node 23 is introduced in the embodiment according to FIG. 6 after the switch S23, said further circuit node 23 leading to the switch S26 to be closed in the clock phase 6 as well as to a capacitor 15'. A further circuit node 22 follows the capacitor 15' in the shunt arm, proceeding from which the switch S36 leads directly to the reference potential 18 at the input terminal 21. A further switch S43 which also leads to the capacitor 15 lies at the circuit node 22. The switches S26 and S36 added to FIG. 6 in comparison to FIG. 1 are closed during the clock phase 6, whereas the switch S43 is closed simultaneously with the switches S23 and S13 during the clock phase 3. The capacitance ratios are completely retained for the loss-free circuit; however, the capacitance values have only been multiplied by the factor 2 for the purpose of a better overview.

The physical manner of functioning for the partial circuits employed in the circuits will be explained below on the basis of FIGS. 7 and 8.

Because SC filters are a form of analog sampling systems which, as already mentioned, process sampling sequences, equivalent currents and equivalent voltages must be defined which, after application of the bilinear transformation, lead to realizable, rationally fractional two-terminal networks or, respectively, transfer functions. Because in general the signals are input to or output from the SC filter in the form of voltage values, it is particularly important to select a reality-related voltage definition so that no matching circuits are required for the coupling-in or, respectively, coupling-out of the signals.

The voltages at the capacitors of a switched capacitor network jump from a prior value $u_b(nT) = U_b \cdot e^{pnT}$ to a post value $u_a(nT) = U_a \cdot e^{pnT}$ in the flow of charge packets controlled by the clock time plan.

$$U(z) = U_a(z) \quad (1)$$

is defined as the equivalent voltage with which subsequent calculations will be carried out. This determination renders possible not only the simplest possible signal coupling-in or coupling-out but also facilitates the interconnection of the network elements yet to be discussed below into an SC filter.

There follows from the charge definition $$q(nT) = \int_{\frac{2n-1}{2}T}^{\frac{2n+1}{2}T} i(t)\, dt \quad (2)$$

The current definition $$I(z) = \frac{2}{T} \cdot \frac{z}{z+1} \cdot Q(z). \quad (3)$$

These charge and current definitions are selected in such manner that the simplest realization ensues in the SC filter for the two-terminal network element occurring most frequently in coil-saving LC filters, with the new frequency variable s defined as $$s = \Sigma + j\Omega = \frac{2}{T}, \psi \text{ where}$$

$$\psi = \frac{z-1}{z+1} = \tanh \frac{pT}{2} = \epsilon + j\phi \text{ and}$$

$$p = \sigma + j\omega.$$

In the following, the two-terminal network capacitance, resistance and inductance are realized upon employment of the voltage and current definitions (1) and (3) and the influences of the parasitic capacitances and of the non-ideal operational amplifier are analyzed.

Figure 7:
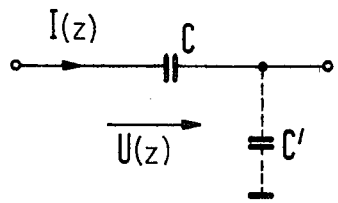
FIG. 7 is a two-terminal network in the form of a capacitance C which has a grounded capacitance C' constructed in accordance with the principles of the present invention.

As already mentioned above, the definitions (1) and (3) result in a particularly simple realization of the impedance $Z(s) = 1/sC$ for the capacitance shown in FIG. 7. There follows $$Q(z) = C(U_a - U_b)$$

with $$U_z = U, \; U_b = Uz^{-1}$$

so that $$Q(z) = C \cdot U(z)(1 - z^{-1})$$

$$\text{and } I(z) = \frac{2C}{T} \cdot \frac{z-1}{z+1} \cdot U(z). \quad (5)$$

The index "a" (after) indicates the state after the switching and, correspondingly, the index "b" (before) indicates the state before the switching.

Applying the above, $$Z = \frac{U}{I} = \frac{T}{2C} \cdot \frac{z+1}{z-1} = \frac{R_c}{\psi} = \frac{1}{sC}, \quad (6)$$

where $R_c$ is the step resistance of the capacitance.

The ground capacitance C' accompanying the floating capacitor C can already be calculated in in the design of the time-invariant reference filter.

Figure 8:
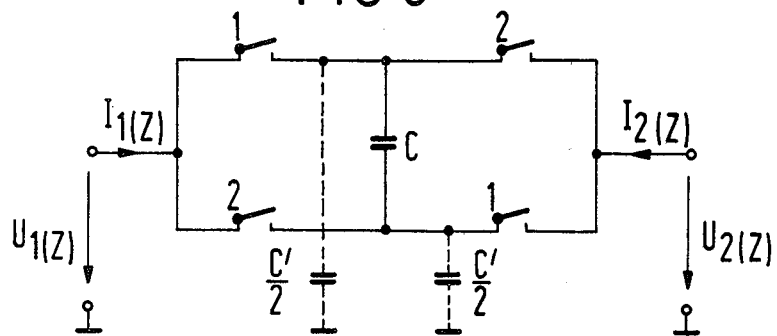
FIG. 8 is a two-terminal network for the simulation of an ohmic resistance in which having grounded capacitances C'/2 constructed in accordance with the principles of the present invention.

FIG. 8 shows a circuit for the simulation of a resistance. According to the references initially cited, a constant, real impedance can be realized by means of a periodically reversed capacitor. This ensues at capacitor C due to the switches closed during the clock phases 1 or 2.

Without taking the ground capacitance into consideration, there first applies $$U(z) = U_1(z) - U_2(z)$$

and $$I(z) = I_1(z) = I_2(z),$$

as well as $$U_b = -U_a z^{-1}.$$

There thus follows $$Q(z) = -C(U_a - U_b) = CU(1 + z^{-1})$$

and further $$I(z) = 2C/T \cdot U(z)$$

and $$Z = U/I = T/2C = R_c. \quad (7)$$

It is particularly important here to symmetrically arrange the ground capacitance according to FIG. 2 accompanying the floating MOS capacitor. If this parasitic capacitance were not symmetrically divided, then the topology of the network would only repeat every 2T seconds. This would in turn result in the generation of additional image frequencies $$\frac{(n+1)}{2} \Omega \pm \omega$$

and, thus more stringent demands made of the time-invariant pre- or post-filter. In the following, therefore, symmetrically divided ground capacitances of a periodically reversed MOS capacitor are assumed.

Given this precondition, the following relationship ensues for the arrangement in FIG. 8:

$$\begin{bmatrix} I_1(z) \\ I_2(z) \end{bmatrix} = \begin{bmatrix} \frac{2}{T}\left(\frac{z-1}{z+1} \cdot \frac{C'}{4} + C + \frac{C'}{4}\right), & \frac{2}{T}\left(\frac{z-1}{z+1} \cdot \frac{C'}{4} - C - \frac{C'}{4}\right) \\ \frac{2}{T}\left(\frac{z-1}{z+1} \cdot \frac{C'}{4} - C - \frac{C'}{4}\right), & \frac{2}{T}\left(\frac{z-1}{z+1} \cdot \frac{C'}{4} + C + \frac{C'}{4}\right) \end{bmatrix} \cdot \begin{bmatrix} U_1(z) \\ U_2(z) \end{bmatrix} \quad (8)$$

an equivalent circuit can be derived from this conductance matrix, said equivalent circuit consisting of a lattice filter with half the step resistance (R/2) in the on-line branches and the capacitance C'/2 in the diagonal branches. A bridged T-element which can be likewise employed for circuit designs is, as is known, equivalent to this cross-element equivalent circuit.

This non-minimal-phase character of the network caused by the parasitic ground capacitances does not influence the SC filter at all, because it occurs only at the terminals.

In contrast to known circuits, RC active realization with the two-terminal network realizations and the associated disadvantages initially discussed is not used herein for the realization of an inductive impedance. On the contrary, what is sought is a direct realization of the differential equations which derive for the two-terminal network "inductances" (cf. FIGS. 1 through 6). The impedance is defined by $$Z = \frac{U(z)}{I(z)} = \frac{2}{T} \cdot \frac{z-1}{z+1} \cdot L = \frac{z-1}{z+1} \cdot \frac{T}{2C}. \quad (9)$$

With the definitions (1)–(3), there derives from (9)

$$U(z) \cdot C =$$

$$\frac{T}{2} \cdot \frac{z-1}{z+1} \cdot \frac{2}{T} \cdot \frac{z}{z+1} \cdot Z(z) = \frac{1 - z^{-1}}{(1 + z^{-1})^2} \cdot Q(z).$$

Further, there applies $$Q(z) = C(U_z(z) - U_b(z)) = CU(z)\left(1 - \frac{U_b}{U_a}(z)\right). \quad (10)$$

By means of comparison of (9) and (10), one obtains $$\frac{U_b}{U_a}(z) = -\frac{z^{-2} + 3z^{-1}}{1 - z^{-1}}. \quad (11)$$

What is sought is a circuit which realizes the transfer function (11) and which takes its input signal $U_a$ from the capacitor realizing the inductor and forces the output voltage $U_b$ on said input signal even before arrival of the next charge packet. On the basis of the denominator polynomial $N(z) = 1 - z^{-1}$ in (11) one can see that this arrangement realizing the transfer function must have the characteristics of an integrator. The varying weighting factors for the forward delays can be realized by means of charge distribution given an appropriately selected C-ratio.

One can determine from the transfer function (11) which is realized given the realization of an inductor that the voltage at the operational amplifier output $U_b$ can exceed the signal voltage at the inductor $U = U_a$.

The output $U_b$ may be reduced by the factor two as shown in FIG. 6, which has already been explained in its essential details.

The ground capacitances occurring in the circuit in FIG. 6 can be fully taken into consideration. In the realization of a floating coil with reduced level control, the influence of the ground capacitances cannot be eliminated without substantial numbers of additional elements. An additional amplifier, however, can simultaneously create a compensation for two neighboring floating coils.

The voltage at the output of the operational amplifier $U_b$, as the coil voltage $U_a$, follows the signal voltage. The steps in the step-shaped curve become smaller with a decrease in signal frequency relative to the clock frequency. Although the capacitance C (FIG. 4) must, in certain cases, be considerably reloaded, the entire operational amplifier need not respond across all stages in these reloading operations.

Figure 9:
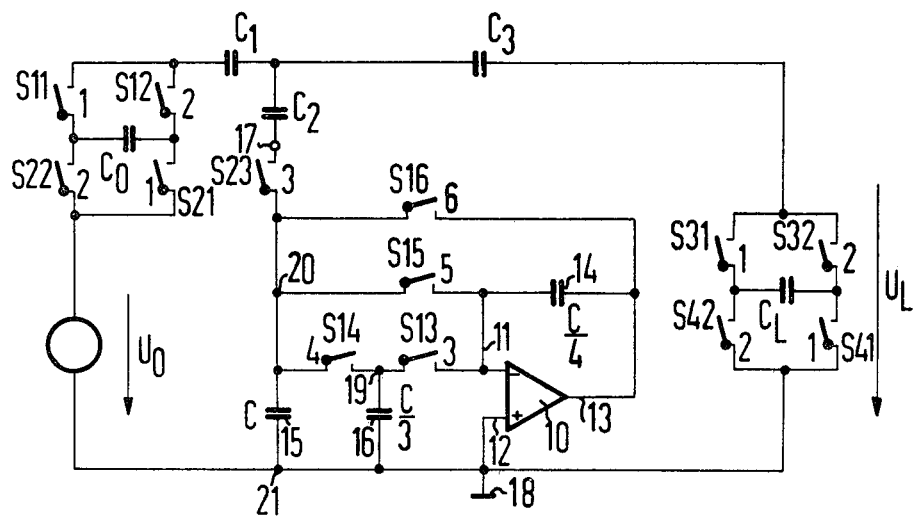
FIG. 9 is a circuit diagram for an SC high pass filter which is operated at a voltage $U_O$ with a clocked internal resistance $C_O$ and a clocked load resistance $C_L$ and output voltage $U_L$ at the load resistance $C_L$ constructed in accordance with the principles of the present invention.
Figure 10:
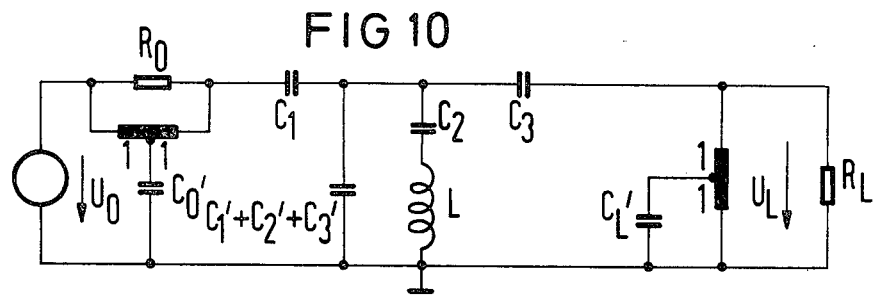
FIG. 10 is an equivalent circuit of the circuit illustrated in FIG. 9.

A high pass filter circuit of order 3 is shown in FIGS. 9 and 10 as a realization example for a filter circuit, said high pass filter circuit of order 3 containing the capacitors $C_1$ and $C_2$ in its series arms and containing a series resonance circuit consisting of the capacitors $C_2$ and coil L in the shunt arm lying therebetween. As switch capacitances, there additionally arise the ground capacitances belonging to the capacitors $C_1$ through $C_3$, which are a sum capacitance $C_1' + C_2' + C_3'$ parallel to the series resonant circuit containing $C_2$ and L. The voltage source $U_O$ with the internal resistance $R_O$ and the load resistor $R_L$ at which the output voltage $U_L$ occurs can also be seen in FIGS. 9 and 10 and the respective ground capacitances $C_O'$ and $C_L'$ are taken into consideration by respective transformers T1 and T2 with the transmission ratio 1:1 each respectively connected in parallel to the resistors $R_O$ and $R_L$.

A comparison of FIGS. 1, 7 and 9 with FIG. 10 shows that the circuit elements explained on the basis of those aforementioned figures are introduced into FIG. 9. Thus, the coil according to FIG. 10 is completely simulated in FIG. 9 between the terminals 17 and 21 of FIG. 1. The capacitive elements $C_1$, $C_2$ and $C_3$ from the circuit of FIG. 10 belonging to the high pass filter circuit are also directly simulated in the circuit according to FIG. 9 as capacitors $C_1$, $C_2$ and $C_3$ at precisely the same circuit locations. Analogously, the effective resistance according to FIG. 8 for the resistor $R_O$ is simulated by the periodically reversed capacitor $C_O$ in FIG. 9 as it is for the load resistor $R_L$ by the periodically reversed capacitor $C_L$. In accord with FIG. 7, the clock phases are referenced with 1 and 2 in FIG. 9 for the switches to be reversed at the capacitor $C_O$ and at the capacitor $C_L$. For the purpose of differentiation, the switches at capacitor $C_O$ are referenced at S11 and S21, and at S12 and S22, and the switches at capacitor $C_L$ are referenced at S31 and S41, and at S32 and S42.

The realization of differently designed filter circuits can also be achieved by means of analogous application of the above explanations, particularly by means of the employment of floating coils according to FIG. 4 which can be employed in the simulation of low pass filters, band pass filters or, respectively, band stop filters.

Figure 11:
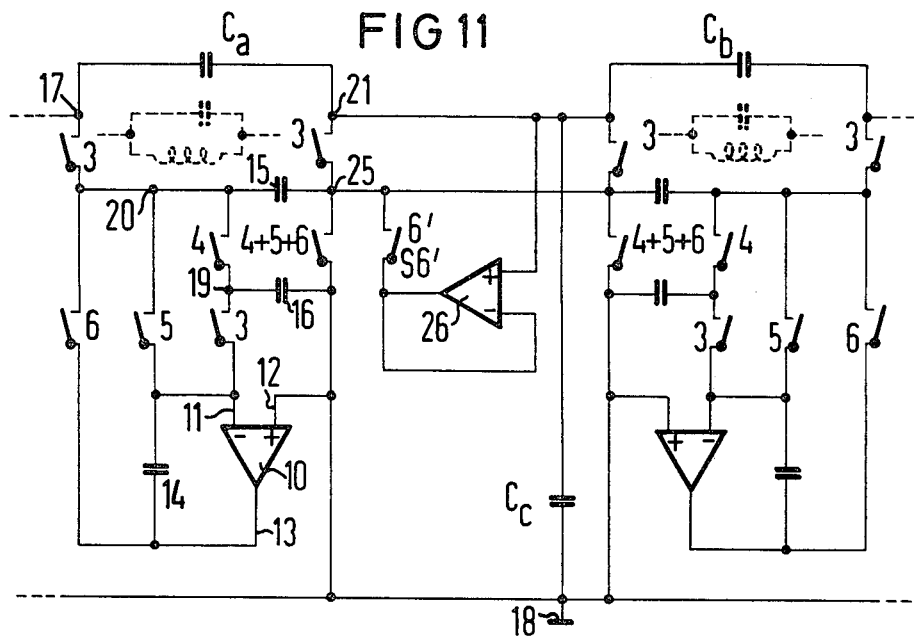
FIG. 11 is a circuit diagram for the realization of two floating parallel resonance circuits with compensation of the parasitic grounded capacitances constructed in accordance with the principles of the present invention.

An advantageous variant for low pass filter circuits is shown in FIG. 11 with the broken lines at the circuit input and at the circuit output indicating only a section of such a low pass filter circuit. The circuit simulated in FIG. 11 has a shunt arm with a capacitor $C_c$ and two parallel resonance circuits in a series arm, as can be seen by means of the electrical equivalent circuits indicated with broken lines. A floating inductor according to FIG. 5 is connected to the capacitors referenced at $C_a$ and $C_b$ in the series arms, the operation of which has already been described in connection with FIG. 5. For the purpose of a better overview, the individual switches are identified in FIG. 11 by means of the clock phases during which a switch is closed. In the circuit of FIG. 11, a voltage amplifier 26 with a gain of 1 is additionally employed. The voltage amplifier 26 is connected to the circuit node 25 via a switch S6' which is closed during the clock phase 6' (cf. FIG. 2), at which circuit node 25 the capacitor 15 is also connected, i.e., that capacitor which exhibits the largest capacitance value for the inductor simulation according to FIG. 4. With the arrangement of FIG. 11 the parasitic leakage admittances occurring with floating inductors can be eliminated.

A new clock phase 6' which is inserted between the clock phases 6 and 13 is required for operation of the circuit of FIG. 11. The fact that the non-inverting input of the additional operational amplifier does not lie at ground is not a disadvantage in the circuit of FIG. 11 for the reason that the amplifier is not switched over and its input capacitance can be fully calculated into the operation of the remainder of the circuit.

Figure 12:
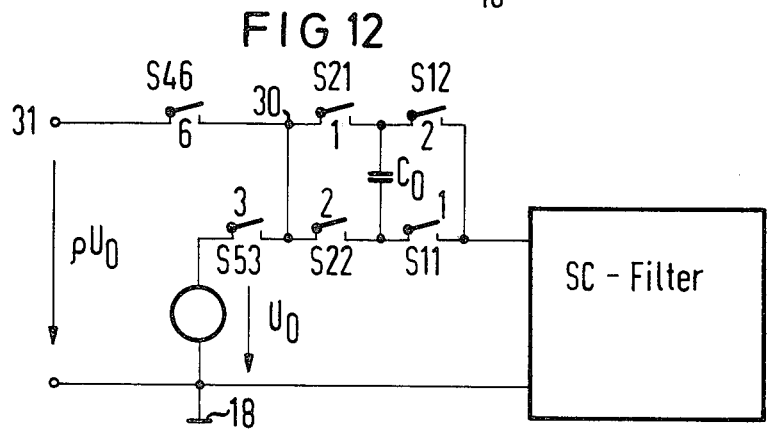
FIG. 12 is a circuit diagram for the extraction of a reflected signal by means of which a dynamic systems behavior can be achieved in the manner of a shunt circuit which is inverse to the dynamic systems behavior of the filter connected in the circuit constructed in accordance with the principles of the present invention.

In the circuit of FIG. 12, the signal reflected by a SC filter is exploited as the output signal of the circuit. In the illustrated circuit, the signal generator $U_O$ is connected to the remaining SC filter circuit via a switch S53 which is closed during the clock phase 3. The periodically reversed capacitor (cf. FIG. 9) simulating the generator internal resistance $C_O$ is conducted to a further circuit node 30. The switch S46 leads from this circuit node to an output terminal 31 and the signal $\rho \cdot U_O$ ($\rho$=reflection factor) reflected by the SC filter can be tapped between the terminal 31 and reference potential 18 if the switch S53 is closed during the clock phase 3 and the switch S46 is closed during the clock phase 6. Such a circuit thus functions as a strict shunt circuit.

In general the reflected signal can be tapped at specific points in time at the input and output of the SC filter without substantial additional circuit outlay. The only necessary condition is that a non-switched capacitive path exist to ground from the respective port of the filter. In nearly all cases, this condition will already be met because of the consideration of the ground capacitances.

Further, due to the identical design of the load resistance with a second signal source, the SC filter can be simultaneously employed in both transfer directions, however, the cross-talk attenuation between both transfer directions is identical to the reflection attenuation of the SC filter.

Figure 13:
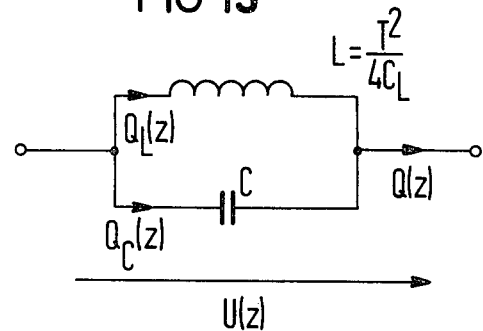
FIG. 13 is an equivalent circuit of a parallel resonance circuit realized with the inductor $L=T^2/4C_L$ and the capacitance C.

FIG. 13 is a schematic representation showing that the charge $Q_L(z)$ is picked up by the inductor L and the charge $Q_C(z)$ is picked up by the capacitor C, so that, overall, the charge $Q(z)$ is transported in the floating parallel resonance circuit. The voltage drop occurring is referenced with U(z). Accordingly, the constant $C_L = T^2/4L$ can be directly determined from the inductor L to be realized for the parallel resonance circuit and from the system-inherent clock period T. Further dimensioning magnitudes are indicated on the basis of FIGS. 1 through 12, and the use of the so-called z-transformation which is frequently employed in the calculation of keyed systems is also pointed out.

A circuit is shown in 14 which coincides in many significant parts with the circuit of FIG. 4, the operation of which was explained above. The statements concerning FIGS. 1 through 13 in which the physical manner of functioning and the clock diagram required for the control of the switches are illustrated also apply to FIG. 14. Further, elements with the identical function are referenced with the same reference symbols and the clock phases in which the individual switches are closed are also directly indicated in FIG. 14 at the individual switches. In accord with FIG. 4, the corresponding switch elements can thus be directly seen in FIG. 14.

Figure 14:
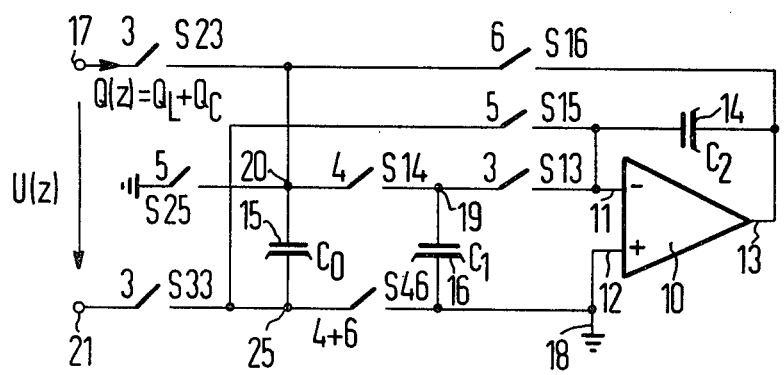
FIG. 14 is a further diagram for an active circuit realizing the parallel resonance circuit of FIG. 13.

In FIG. 14, the input voltage U(z) lies between the input terminals 17 and 21 and, following these terminals are the switch S23, the switch S33 each of which close at the clock phase 3. The capacitor 15 is interconnected between circuit nodes 20 and 25. A switch S14 closing during the clock phase 4 leads from the circuit node 20 to a further circuit node 19, proceeding from which the capacitor 16 leads to reference potential 18. The integration element consists of an operational amplifier 10 having an inverting input is referenced at 11 and a non-inverting input referenced at 12 and an output 13 connected to the inverting input 11 through the capacitor 14. In the further circuit arms are switches S16, S15 and S13 which are respectively closed during the clock phases 6, 5 and 3.

In contrast to FIG. 4, the switch S15 of FIG. 14 is not connected to the circuit node 20 but rather to the circuit node 25. Further, the switch S46 lying in the lower series arm closes during the clock phases 4 and 6. A switch S25 is added in FIG. 14 which closes during the clock phase 5 and connects the circuit node 20 to reference potential 18 during this clock phase.

The charge $Q(z) = Q_L(z) + Q_C(z)$ can be picked up at the input terminals 17 and 21 following the demand according to the equivalent circuit of FIG. 13, i.e., a simulated loss-free parallel circuit, when the following relationships are observed:

$$C_0 = C + C_L, \quad C_1 = \frac{C_0^2}{3C_L - C}, \quad C_2 = \frac{C_0^2}{4C_L}, \quad C_L = \frac{T^2}{4L}.$$

In order to make the difference with respect to the dimensioning according to FIG. 4 clear, the capacitance values of the capacitors 15, 16 and 14 are respectively referenced with $C_o$, $C_1$ and $C_2$ in FIG. 14.

Resonance circuits whose resonant frequency is smaller than F/6 can be realized with the dimensioning described above in which cases the switch S25 is not required and the circuit is constructed and operated according to FIG. 4.

Resonance circuits whose resonant frequency is greater than F/6 can be achieved with the switch S25 closing at clock phase 5, whereby a reversal of the capacitor 15 is achieved during the clock phase 5 so that, in this case, the circuit is thus constructed according to FIG. 14 and is operated according to the clock diagram specified thereto.

The circuits described above thus have the advantage that active circuits can be realized with the character of the floating parallel resonance circuit whose parallel resonant frequency is either smaller or greater than one-sixth of the system-inherent clock frequency F with only minimal additional circuit outlay.

Although modifications and changes may be suggested by those skilled in the art, it is the intention of the inventor to embody within the patent warranted hereon all changes and modifications which reasonably and properly come within the scope of his contribution to the art.

I claim as my invention:

1. In a switched-capacitor filter circuit having first and second input terminals and an operational amplifier having a capacitor connected between the output and the inverting input thereof, said operational amplifier further having a non-inverting input connected to a reference potential, the improvement of:
   a first clock pulse-controlled switch interconnected between the inverting input of said operational amplifier and a first circuit node;
   a first capacitor interconnected between said first circuit node and said reference potential;
   a second clock pulse-controlled switch interconnected between said first circuit node and a second circuit node;
   a second capacitor interconnected between said second circuit node and said reference potential;
   a third clock pulse-controlled switch interconnected between the inverting input of said operational amplifier and said second circuit node;
   a fourth clock pulse-controlled switch interconnected between the output of said operational amplifier and said second circuit node; and
   a fifth clock pulse-controlled switch interconnected between said second circuit node and said first input terminal,
   said first and fifth clock pulse-controlled switches being closed during a first clock pulse and said second, third and fourth clock pulse-controlled switches being respectively closed during a second, a third, and a fourth clock pulse, said first, second, third and fourth clock pulses being sequential and non-overlapping.

2. The filter circuit of claim 1 wherein the capacitor interconnected between the output and the inverting input of the operational amplifier has a capacitance which is one-fourth of the capacitance of said second capacitor, and wherein said first capacitor has a capacitance which is one-third of the capacitance of said second capacitor.

3. The filter circuit of claim 1 further comprising:
   a sixth clock pulse-controlled switch interconnected between said second capacitor and said second output terminal; and
   a seventh clock pulse-controlled switch interconnected between said second capacitor and said reference potential,
   said sixth clock pulse-controlled switch being closed during said said first clock pulse and said seventh clock pulse-controlled switch being closed during each of said second, third and fourth clock pulses.

4. The filter circuit of claim 1 further comprising:
   a third capacitor interconnected between a third and a fourth circuit node, said third circuit node being disposed between said second circuit node and said fifth clock pulse-controlled switch;
   an eighth clock pulse-controlled switch interconnected between said second and third circuit nodes;
   a ninth clock pulse-controlled switch interconnected between said fourth circuit node and said second capacitor; and
   a tenth clock pulse-controlled switch interconnected between said fourth circuit node and said second input terminal,
   said ninth clock pulse-controlled switch being closed during said first clock pulse and said eighth and tenth clock pulse-controlled switches being closed during said fourth clock pulse.

5. The filter circuit of claim 4 wherein said third capacitor has a capacitance equal to the capacitance of said second capacitor.

6. The filter circuit of claim 1 wherein a voltage source, a simulated internal resistance, a fourth capacitor and a fifth capacitor are connected in sequence between said second and first input terminals, and wherein a sixth capacitor and a simulated load resistance are connected in sequence between said fourth and fifth capacitors and said reference potential and wherein said second input terminal is connected to said reference potential, and wherein
   said simulated internal resistance is comprised of a bridge having parallel first and second internal bridge switches connected to said voltage source, and parallel third and fourth internal bridge switches connected to said fourth capacitor and a periodically reversed internal bridge capacitor interconnected between said first and third internal bridge switches and said second and fourth internal bridge switches; and
   said simulated load resistance is comprised of a bridge having parallel first and second load bridge switches connected to said reference potential, and parallel third and fourth load bridge switches connected to said sixth capacitor, and a periodically reversed load bridge capacitor interconnected between said first and third load bridge switches and said second and fourth load bridge switches,
   said second and third internal bridge switches and said second and third load bridge switches being closed during a fifth clock pulse and said first and fourth internal bridge switches and said first and fourth load bridge switches being closed during a sixth clock pulse, said fifth and sixth clock pulses respectively beginning simultaneously with alternating fourth clock pulses and respectively terminating simultaneously with alternating first clock pulses.

7. The filter circuit of claim 3 wherein a node at which said second capacitor and said sixth and seventh clock pulse-controlled switches are connected is defined as a fifth circuit node, further comprising:
   a voltage amplifier having a non-inverting input connected to said second output terminal, and having an output; and
   an eleventh clock pulse-controlled switch interconnected between the output of said voltage amplifier and said fifth circuit node, said eleventh clock pulse-controlled switch being closed during a seventh clock pulse which occurs between said sixth clock pulse and said first clock pulse.

8. The filter circuit of claim 6 wherein a node at which said simulated internal resistance and said voltage source are connected is defined as a sixth circuit node, further comprising:
- a twelfth clock pulse-controlled switch interconnected between said sixth circuit node and an output terminal; and
- a thirteenth clock pulse-controlled switch interconnected between said voltage source and said sixth circuit node,
    said twelfth clock pulse-controlled switch being closed during said fourth clock pulse and said thirteenth clock pulse-controlled switch being closed during said first clock pulse.

9. The filter circuit of claim 1 wherein said second capacitor has a capacitance $C_0$, said first capacitor has a capacitance of $C_1$, and said capacitor interconnected between the output and the inverting input of said amplifier has a capacitance of $C_2$, and wherein the filter circuit simulates a parallel resonance circuit having a capacitance C and an inductance L, said capacitances $C_0$, $C_1$ and $C_2$ having the relationship:

$$C_0 = C + C_L, \quad C_1 = \frac{C_0^2}{3C_L - C}, \quad C_2 = \frac{C_0^2}{4C_L},$$

where $C_L = T^2/4L$ and T is the period between successive pulses in any of said clock pulse sequences.

* * * * *